United States Patent [19]

Harari

[11] 4,070,211

[45] Jan. 24, 1978

[54] TECHNIQUE FOR THRESHOLD CONTROL OVER EDGES OF DEVICES ON SILICON-ON-SAPPHIRE

[75] Inventor: Eliyahou Harari, Irvine, Calif.

[73] Assignee: The United States of America as represented by the Secretary of the Navy, Washington, D.C.

[21] Appl. No.: 784,383

[22] Filed: Apr. 4, 1977

[51] Int. Cl.² .................................................. H01L 21/22
[52] U.S. Cl. ...................................... 148/187; 148/1.5; 156/649; 357/56
[58] Field of Search ................... 148/187, 1.5; 156/17, 156/649; 357/56

[56] References Cited

U.S. PATENT DOCUMENTS

| | | | |
|---|---|---|---|
| 3,698,966 | 10/1972 | Harris | 148/187 |
| 3,730,778 | 5/1973 | Shannon et al. | 148/187 |
| 3,832,246 | 8/1974 | Lynch | 148/187 X |
| 3,899,363 | 8/1975 | Dennard et al. | 148/1.5 |
| 3,958,266 | 5/1976 | Athanas | 357/49 X |
| 3,974,515 | 8/1976 | Ipri et al. | 357/55 X |
| 3,997,367 | 12/1976 | Yau | 148/1.5 |
| 4,002,501 | 1/1977 | Tamura | 148/1.5 |

Primary Examiner—G. Ozaki
Attorney, Agent, or Firm—R. S. Sciascia; Philip Schneider; William C. Daubenspeck

[57] ABSTRACT

A self-aligning technique for doping the edges of metal-oxide-semiconductor devices fabricated on silicon-on-sapphire to eliminate channel-edge conduction at voltages lower than the device threshold voltage without unnecessarily doping the top conducting surface of the device. A thick masking layer is deposited on the silicon layer. The masking layer is etched locally to expose the silicon in the regions between the devices and the exposed silicon is etched to form islands on the sapphire substrate. In a new step, a partial etch of the masking layer is conducted to expose a narrow frame on the top surface and edges of the silicon island. The resulting structure may be doped by any conventional method to ensure heavier doping at the edges than in the transistor channel region.

8 Claims, 5 Drawing Figures

TECHNIQUE FOR THRESHOLD CONTROL OVER EDGES OF DEVICES ON SILICON-ON-SAPPHIRE

BACKGROUND OF THE INVENTION

This invention relates in general to silicon-on-sapphire technology, and more particularly, to a technique for threshold control over the edges of metal-oxide-semiconductor devices fabricated on an insulating substrate such as sapphire or spinel.

Metal-oxide-semiconductor (MOS) devices fabricated on silicon-on-sapphire (SOS) offer higher speed, simplified circuit design, and improved radiation hardness in comparison with bulk MOS technology. The very good dielectric isolation between adjacent devices provided by the sapphire insulating substrate permits high packing density for MOS/SOS circuits.

In conventional SOS processing, a layer of silicon is epitaxially deposited on a sapphire substrate and silicon is etched away from the region between adjacent devices to form silicon islands on the substrate. Typically, the top surface of the silicon islands has a <100> Miller indices orientation, however, as a consequence of the nature of the silicon etching techniques, the edges of the islands (where the etching was performed) have different orientations. For example, if a preferential silicon etch was used, the edges of the islands will have <111> Miller indices.

The different orientation of the edges results in a density of surface states and fixed charges in the edges different from that in the top surface. Consequently, the channel edges may conduct a voltage lower than the threshold voltage of the top surface. This conduction between the source and drain in the channel edges (2 edges per transistor) at a voltage lower than the threshold voltage of the top surface is undesirable since the edges function as parasitic transistors which turn on before the main transistor (top surface). This problem usually manifests itself in n-channel devices.

Channel-edge conduction problems have been controlled by fabricating edgeless devices of circular geometry or by heavily doping the channel edges so that they cannot be inverted. The circular edgeless devices are more complex to construct and cannot be made in the small geometries of rectilinear devices; thus they have a lower packing density. The prior art techniques of doping the channel edges are unsatisfactory for small-geometry rectilinear devices because the top surface of the channel is masked in a separate step to protect it while the edges are doped. In devices with a small channel width, the processing error necessarily involved in masking the top surface results in a significant portion of the top surface being doped. This in turn significantly lowers the active area of the transistor. For example, in a device having a five-micron channel width, if one micron of the top surface is doped while doping each edge, the current available from the device will be reduced by forty percent.

SUMMARY OF THE INVENTION

The present invention provides a technique in which the channel edges of an MOS device fabricated on SOS may be heavily doped so that they do not conduct before the device reaches threshold voltage, thus eliminating the problem of channel-edge conduction. This technique does not require an extra masking step as in the prior art, is self-aligning to the silicon islands so that only the region very close to the edges is heavily doped, and enables efficient use of the top-surface channel for conduction.

Briefly, to accomplish the above purpose, a thin thermal oxide is grown on a silicon layer which has previously been epitaxially deposited on a sapphire substrate. In a new step, a thick oxide (up to one micron) is deposited on top of the thin oxide and densified. Silicon islands are defined in this oxide and the latter is etched to expose the surface of the silicon in the field regions. The silicon is then etched in a conventional manner to remove the silicon from the regions between the devices, forming silicon islands that have edge orientations different from the top surface orientation. In a new step, a partial etch of the oxides is performed. Since the oxide etch-rate is easily controllable to within 100 angstrom units per minute, a narrow layer may be removed from the top and sides of the oxide. The remaining oxide leaves a narrow frame of the top surface as well as all the silicon edges exposed. The remainder of the top silicon surface is completely protected by the unetched oxide. The channel edges may now be doped by any of the conventional doping methods without unnecessarily doping the top surfaces.

DESCRIPTION OF THE PREFERRED EMBODIMENT

Figure 1:
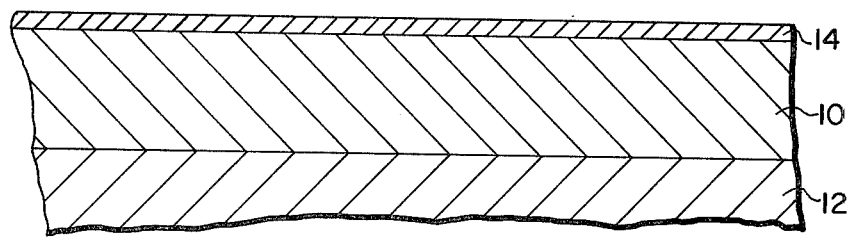
FIG. 1 through FIG. 5 illustrate, in a series of schematic cross-sectional views, a series of process steps which may be used in doping the edges of silicon islands on sapphire according to the present invention.

Referring now to FIG. 1, there is shown an epitaxial layer of silicon 10 which has been grown on a thick, polished, sapphire substrate 12 by conventional techniques. Typically, the silicon layer 10 has a thickness of 0.5 - 1.0 microns and a top surface orientation of <100> Miller indices. A thin thermal oxide layer 14, typically 300 angstrom units thick, is grown on the silicon layer 10. In conventional processing, thermal oxide layer 14 is used as a mask during removal of the silicon from the regions between adjacent devices to form silicon islands.

Figure 2:
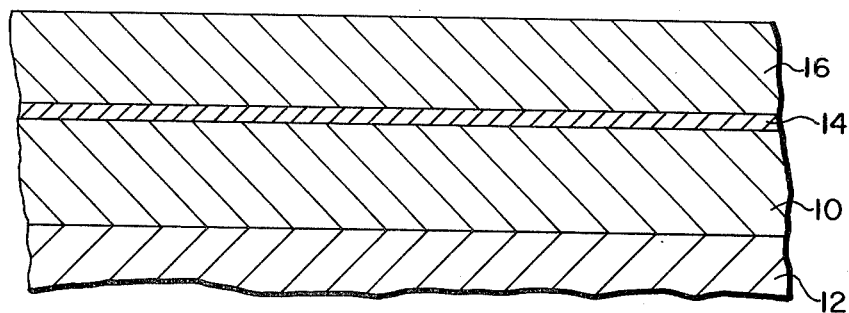

In the present invention, a thick masking layer 16, up to approximately one micron in thickness, is next deposited on top of thin thermal oxide layer 14 and densified, as shown in FIG. 2. Layer 16 is used as a mask to define the silicon islands during the etching of the unwanted silicon and to protect the top surface of the islands during the doping of the edges of the islands as will presently be described. Layer 16 is resistant to the technique used to etch away the unwanted silicon from layer 10 to form silicon islands on the sapphire substrate 12, and also is itself susceptible to controlled etching techniques. Typically layer 16 is formed of silicon dioxide; however, a layer of silicon nitride may be used for the same purpose.

It should be noted that thermal oxide layer 14 is not necessary to the techniques of the present invention, and accordingly may be omitted if desired. However, a thermally grown oxide is generally of higher quality than the deposited oxide of layer 16 and may provide more effective masking when used in conjunction with subsequently deposited masking layer 16.

Figure 3:
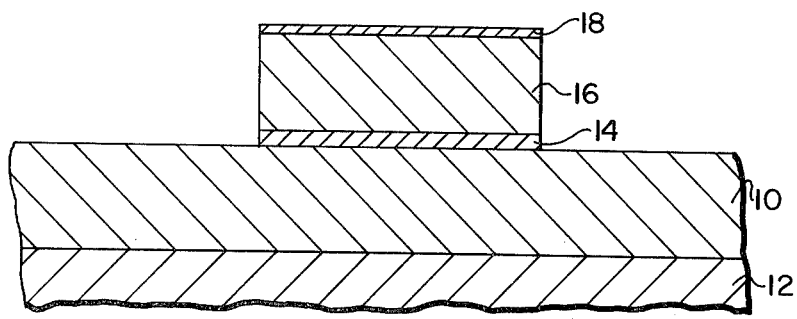

The silicon islands are next formed by conventional techniques. A photoresist layer 18 is deposited by conventional deposition techniques and developed (using photolithographic masking and etching techniques) to define the silicon islands. The masking layers 14 and 16 are etched to expose the surface of the silicon in the field regions as shown in FIG. 3.

Next the exposed silicon is removed by etching using conventional commercial techniques such as plasma etching or preferential etching. These conventional etching techniques form silicon islands in which the edges have different crystal orientations than the top surface. As previously described, the different orientation of the edges may result in the edges conducting before the top surface of the device.

Figure 4:
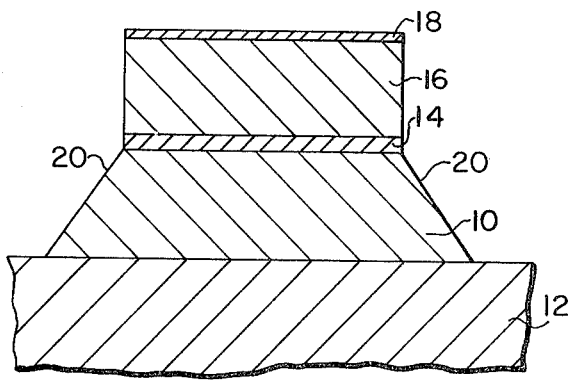

The resulting island, as shown in FIG. 4, is a mesa-like structure with a photoresist layer 18 on top of masking layers 16 and 14 that are on top of silicon layer 10. The sloping edges 20 of silicon layer 10 are indicative of a preferential silicon etch which has caused the edges to be oriented in <111> Miller indices.

Figure 5:
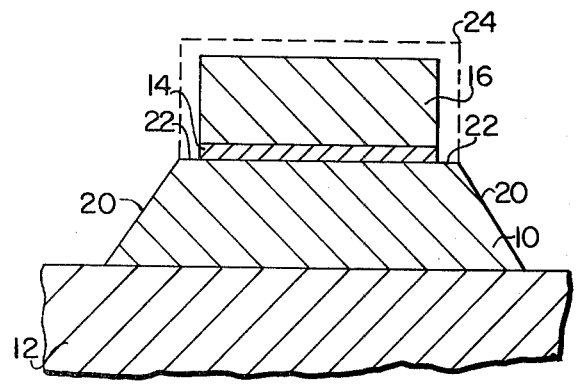

In a novel deviation from the prior art, a partial etch of the masking layers 14 and 16 is performed. A suitable etching solution would be, for example, buffered hydrofluoric acid which selectively etches the silicon dioxide layers 14 and 16 to the exclusion of silicon layer 10. As known to those skilled in the art, the oxide etch rate is easily controllable to within 100 angstrom units per minute. The partial etch may remove a pre-determined portion of the oxide at the edges of the island as indicated by the area numbered 22 in FIG. 5. Because of the thickness of the masking layer 16, the top of layer 16 may be exposed to the partial etch without any deleterious effect on the process. For example, etching for approximately three minutes in 10 to 1 solution of $H_2O$ to HF will result in 3000–5000 angstrom units being removed from the top and sides of the oxide mask (layers 14 and 16), as shown by the dashed line 24. The remaining oxide mask leaves a narrow (3000–5000 angstrom units) frame 22 of top surface silicon and all of the edge surfaces 20 exposed. The remainder of the top silicon surface is completely protected by the unetched oxide. The edges of the silicon island may now be doped by any of the standard doping methods such as thermal diffusion or ion-implantation so that they cannot be inverted so as to conduct before the top surface of the device.

It is also possible to leave the photoresist layer 18 in place during the partial etch thereby protecting the top surface of the oxide so that only the exposed edges of the oxide are etched. If the photoresist layer 18 is in place during the partial etch, masking layer 16 may have a minimum thickness of 1000 to 2000 angstrom units. If the photoresist layer 18 is removed before the partial etch, masking layer 16 has a greater minimum thickness, depending on the amount of etching desired, but typically 6000 to 7000 angstrom units.

Thus, when the word "thick" is used herein to describe the masking layer 16, a layer of approximately 1000 angstrom units to one micron in thickness is denoted if the top surface of the masking layer is protected from the partial etch. On the other hand, if the top surface of masking layer 16 is exposed to the partial etch, the word "thick" denotes a thickness of approximately 6000 angstrom units to one micron.

It will be noted that the partial etch can tolerate a wide margin of processing error. It will be further recognized that not only is a masking step avoided, but also only a very minimal area of the top surface of the silicon is unnecessarily doped because the same mask is used to define the silicon islands and protect the top surface during doping of the edges. Obviously, many modifications and variations of the present invention are possible in light of the above teachings. It is therefore to be understood that within the scope of the appended claims, the invention may be practiced otherwise than as described.

What is claimed and desired to be secured by letters patent of the United States is:

1. In a process for fabricating metal-oxide-semiconductor devices of the type wherein a layer of silicon is formed on an insulating substrate and wherein silicon islands are formed on the substrate by removing the silicon in the region between adjacent devices, the improvement comprising a technique for doping the edges of the silicon islands to prevent channel-edge conduction before the device threshold voltage is reached comprising the steps of:

depositing a thick masking layer on top of the silicon layer;

forming islands on the substrate by etching away portions of the masking layer and the silicon layer, said islands being mesa-like structures including said masking layer and said silicon layer;

partially etching said thick masking layer to remove a portion of the mask from the sides of the mask, thereby exposing a frame of the top surface of the silicon as well as the edges of the silicon island, the remainder of the top surface of the silicon being covered by said masking layer; and doping the exposed edges and the exposed top surface of the silicon to prevent channel-edge conduction.

2. The technique as recited in claim 1 further comprising the step of growing a thin thermal oxide layer on said silicon layer prior to said step of depositing a thick masking layer.

3. The technique as recited in claim 1 wherein said thick masking layer comprises silicon dioxide.

4. The technique as recited in claim 1 wherein said thick masking layer comprises silicon nitride.

5. In a process for fabricating metal-oxide-semiconductor devices of the type wherein a layer of silicon is formed on an insulating substrate and wherein silicon islands are formed on the substrate by removing the silicon in the region between adjacent devices, the improvement comprising a technique for doping the edges of the silicon islands to prevent channel-edge conduction before the device threshold voltage is reached comprising the steps of;

depositing a thick masking layer on top of the silicon layer;

depositing a photoresist layer on top of said thick masking layer;

forming islands on the substrate by etching away portions of the photoresist layer, the masking layer, and the silicon layer, said islands being mesa-like structures including said photoresist layer, said masking layer, and said silicon layer;

partially etching said thick masking layer to remove a portion of the mask from the sides of the mask, thereby exposing a frame of the top surface of the silicon as well as the edges of the silicon island, the remainder of the top surface of the silicon being covered by said masking layer; and doping the exposed edges and the exposed top surface of the silicon to prevent channel-edge conduction.

6. The technique as recited in claim 5 further comprising the step of growing a thin thermal oxide layer on said silicon layer prior to said step of depositing a thick masking layer.

7. The technique as recited in claim 5 wherein said thick masking layer comprises silicon dioxide.

8. The technique as recited in claim 5 wherein said thick masking layer comprises silicon nitride.

* * * * *